United States Patent [19]
Chao et al.

[11] Patent Number: 5,714,398
[45] Date of Patent: Feb. 3, 1998

[54] SELF-ALIGNED TUNGSTEN STRAPPED SOURCE/DRAIN AND GATE TECHNOLOGY FOR DEEP SUBMICRON CMOS

[75] Inventors: Tien Sheng Chao; Horng-Chih Lin, both of Hsin Chu City, Taiwan

[73] Assignee: National Science Council of Republic of China, Taipei, Taiwan

[21] Appl. No.: 680,820

[22] Filed: Jul. 16, 1996

[51] Int. Cl.$^6$ ............... H01L 21/225; H01L 21/255
[52] U.S. Cl. ............... 437/41 SM; 437/160; 437/192; 437/193
[58] Field of Search ............... 437/41 SM, 192, 437/193, 160, 162

[56] References Cited

U.S. PATENT DOCUMENTS

| | | | |
|---|---|---|---|
| 4,330,931 | 5/1982 | Liu | 437/41 |
| 5,168,072 | 12/1992 | Moslehi | 437/41 |
| 5,242,847 | 9/1993 | Ozturk et al. | 437/41 |
| 5,571,744 | 11/1996 | Demirlioglu et al. | 437/57 |

FOREIGN PATENT DOCUMENTS 61-284963  12/1986  Japan ............... 437/195

OTHER PUBLICATIONS

Sze, S. M., Physics of Semiconductor Devices, John Wiley & Sons, 2nd Edition, Year Not Known, p. 469.

Brews, J. R., et al., "Generalized Guide for MOSFET Miniaturization", IEEE Elec. Dev. Lett., vol. EDL-1, No. 1, 1 Jan. 1980, pp. 2–4.

Wolf, S., Silicon Processing for the VLSI Era, vol. 3, Lattice Press, 1995, p. 307.

Taur, Y., et al., "High Transconductance 0.1 mm pMOS-FET", IEEE IEDM Tech. Digest, Dec. 1992, pp. 901–904.

Ting, C.Y., et al., "High Temperature Process on TiSi$_2$", J. Electrochem. Soc., vol. 133, No. 12, Dec. 1986, pp. 2621–2625.

Miller, N.E., et al., "CVD Tungsten Interconnect ... ", Solid State Technology, Dec. 1982, pp. 85–90.

Sekine, M., "Self-Aligned Tungsten Strapped Source/Drain and Gate Technology ... ", IEEE IEDM Tech. Digest, Dec. 1994, pp. 493–496.

*Primary Examiner*—T. N. Quach
*Attorney, Agent, or Firm*—Bacon & Thomas

[57] ABSTRACT

The present invention is to develop a proper new process for deep submicron PMOSFET. The characteristic of this process is using Si:Ge:B layer to deposit on the poly-Si film, then go through oxidation or diffusion method to diffuse the boron ion into the poly-Si gate in order to form p-type poly-Si gate. This layer can be etched selectively after spacer etching and reserve a concave gate structure. Thus, it can combine with selective W-CVD to form an excellent p-type poly-Si PMOSFET.

1 Claim, 3 Drawing Sheets

Poly-Si

Gate oxide diffusion layer

SELF-ALIGNED TUNGSTEN STRAPPED SOURCE/DRAIN AND GATE TECHNOLOGY FOR DEEP SUBMICRON CMOS

BACKGROUND OF THE INVENTION

1. Field of the Invention

The present invention is developing a new process for deep submicron PMOSFET.

2. Description of the Prior Art

As the progress of semiconductor technology, the size of device has been made smaller and smaller. When the channel length of device is smaller than 2 micron, there is so called short-channel effect (S. M. Sze, "Physics of Semiconductor Devices," P.469). The explanation mainly is the valid electric charge in the channel has been shared by the electric field of souse and drain which is more and more close to the devices. There are two common methods to solve this problem. First is to reduce the thickness of gate oxide layer. Second is to reduce the junction depth of source and drain (J. R. Brews, et at, IEEE Electron Devices Lett, EDL-1, 2, 1980).

However, the shallower the junction depth the larger the series resistance, and then cause the reduction of the current flow and lower speed of device (S. Wolf, "Silicon Processing for the VLSI Era," Lattice Press, p.307, 1995). Thus, people are expected to have new devices with low resistant value and shallow junction depth to be developed. Metal Silicon compound is a common material to be used that is TiSi2 compound. This process can be an advantage for self-aligned in gate and source (Y. Taur, IEEE IEDM, p.9-1, 1992; and L. Vain den Hoveet at. Estabstract of the Electrochem. Soc. meeting, Spring, 1988, p.312) which can eliminate one process of lithography etching. However, this process requires twice annealing (C. Y. Ting, et at, J. Electrochem. Soc. p.2631, 1986), with the first low temperature annealing in order to form the TiSi2 compound of self-aligned, and the other annealing is at high temperature to reduce resistance.

However, the process of TiSi2 compound has following problems:

1. When TiSi2 makes the alloy on drain and source, the Si will be provided by the source and drain; thus the junction depth of source and drain can't be very shallow, or there is very serious leakage.
2. If the size of TiSi2 compound become very small, the resistance will be increased a lot and make it impossible to be used in the future (K. Maex, Semiconductor International, p. 75, 1995).

Therefore, to develop other metal TiSi2 compound becomes another choice, and the selective W-CVD is one of most potential product in the future (M. Wong et at, Syrup. on VLSI Technology, p. 101, 1989). The main reason is that selective W-CVD will not consume the Si on the source and drain (N. E. Miller et al, Solid State Technology, p. 8, 1982); thus, can maintain the original junction depth of source and drain, and only deposit on the surface of Si, but will not deposit on the surface of oxide layer, so only require one simply process.

As FIG. 1 shows the conventional selective W-CVD, the process is brief illustrated as following:

After the device finished LOGOS (Local Oxidation of Si), the grow-up the gate oxide layer and go into LPCVD (Low Pressure Chemical Vapor Deposition) to stack on poly-Si as shown in FIG. 1A; then use photoresist to exposure the drawing of poly-Si gate and dry etching, and stack on the oxide layer as shown in FIG. 1B; then utilize ion implantation method to implant light impurity from source and drain, and go through dry etching the oxide layer as shown in FIG. 1C; furthermore, implant heavy-dosage source and drain by using ion implantation, and then have annealing as shown in FIG. 1D; the wafer put into the selective W-CVD system and fill in $SiH_4:WF_6$ gas. Only this process will deposit W-CVD on the Si surface as shown in the black part of FIG. 1E.

However, if the process condition control not adequate, such as spacer too thin or Tungsten selection is not right, the Tungsten on the gate and the Tungsten on source and drain will join together and cause short.

Currently, the main problem of selective W-CVD is how to prevent the short among gate, source and drain.

So, there is a concave gate structure (M. Seldne, et at, IEEE IEDM, p.493, 1994) that has been provided to prevent such problem. This process is briefly illustrated as following:

During production process, the pre-stacking poly-Si is same as FIG. 1; first of all stack one layer of BSG (BoronSilica Glass) on the poly-Si gate as shown in FIG. 2A. After gate etching, process the oxide layer of spacer or deposition of $Si_3N_4$ layer as shown in FIG. 2B. Then, utilize HF vapor which can etch the BSG layer selectively, and reserve the remaining portion to form a concave gate structure as shown in FIG. 2C. Next, is ion implantation (BF2) and annealing of source and drain as shown in FIG. 2D, and then process selective W-CVD deposition as shown in FIG. 2E. Thus, it will have thicker Tungsten deposition, but there is no short happen among gate, source and drain, and it can make a PMOSFET with very shallow junction depth.

SUMMARY OF THE INVENTION

A new process for the self-aligned Tungsten strapped source/drain and gate technology for deep submicron CMOS mainly is to develop a proper new process for deep submicron PMOSFET. The characteristic of this process is using Si:Ge:B layer to deposit on the poly-Si film, then go through oxide or diffuse method to diffuse the boron ion into the poly-Si gate in order to form p-type poly-Si gate. This layer can be eliminated after spacer etching and reserve a concave gate structure. Thus, it can combine with selective W-CVD to form an excellent p-type poly-Si PMOSFET.

DETAILED DESCRIPTION OF THE DRAWINGS

The invention, as well as its many advantages, may be further understood by the following detailed description and drawings in which:

FIGS. 1A–1E. One of the conventional selective W-CVD;

FIGS. 2A–2E. Another of the conventional selective W-CVD;

FIGS. 3A–3E. The present invention is a new process for the self-aligned Tungsten strapped source/drain and gate technology for deep submicron CMOS.

DETAIL DESCRIPTION OF THE PREFERRED EMBODIMENT

Figure 1A:
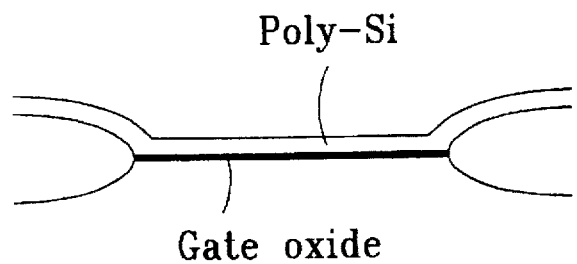
Figure 1B:
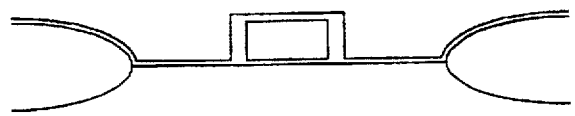
Figure 1C:
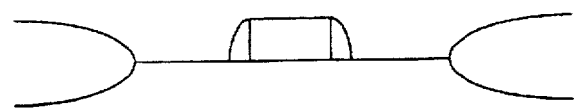
Figure 1D:
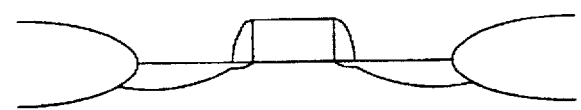
Figure 1E:
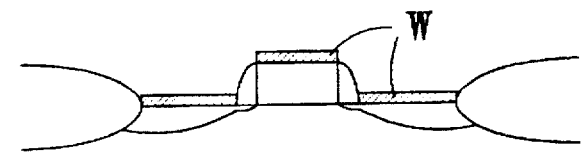
Figure 2A:
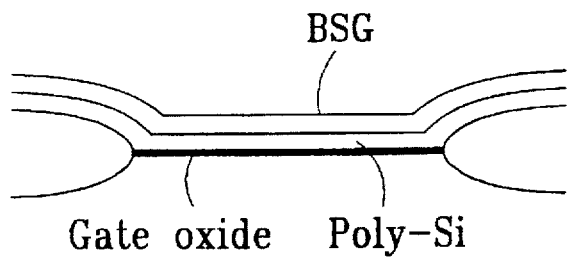
Figure 2B:
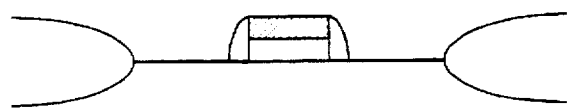
Figure 2C:
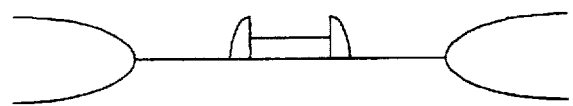
Figure 2D:
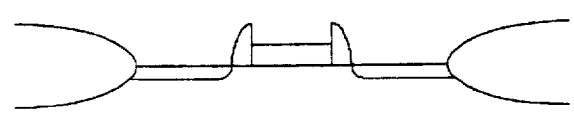
Figure 2E:
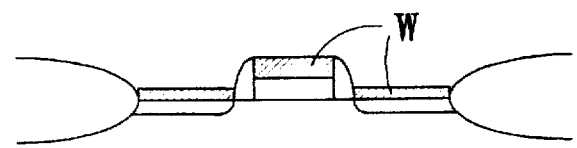
Figure 3A:
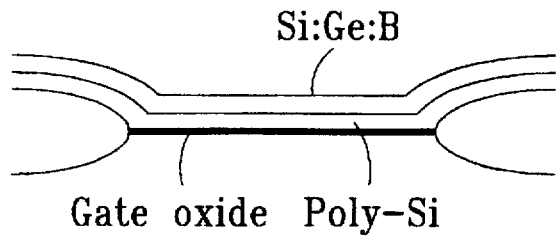
Figure 3B:
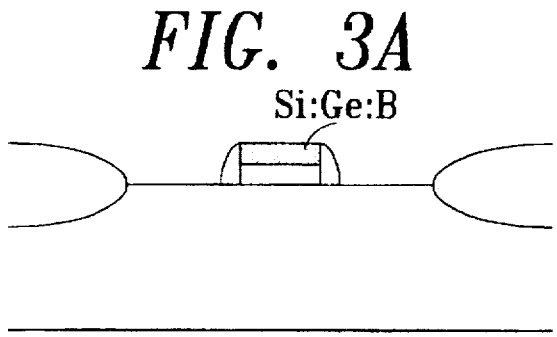
Figure 3C:
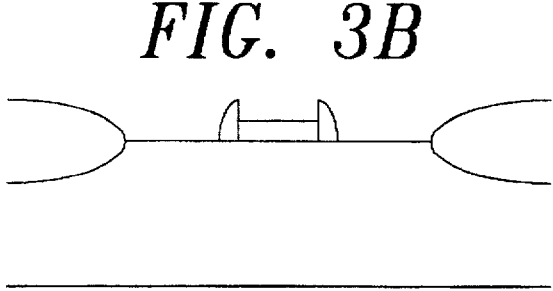
Figure 3D:
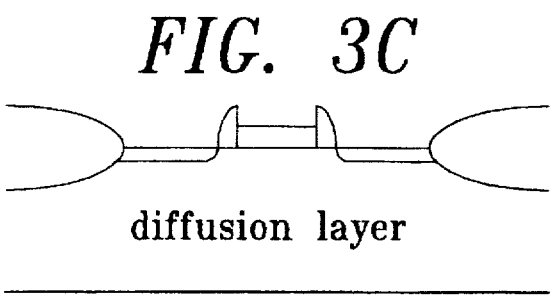
Figure 3E:
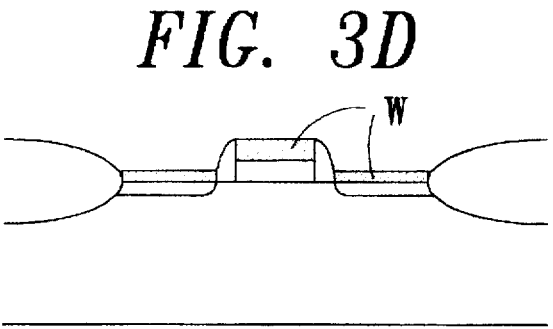

The present invention is a new process for the self-aligned Tungsten strapped source/drain and gate technology for deep submicron CMOS. The process is illustrated as following:

The process of the wafer from the beginning to the poly-Si deposition is same as the conventional process which includes wafer clearance, n-well forming, LOCOS (Local Oxidation of Silicon) to make insulated layer, grow-up gate oxide, deposit poly-Si etc. process; then, the wafer go through LPCVD (Low Pressure Chemical Vapor Deposition) to stack Si:Ge:B layer (using $SiH_4$:$GeH_4$:$B_2H_6$). After another high temperature annealing, the B in Si:Ge:B layer diffuses into the poly-Si gate to form the p-type poly-Si (as shown in FIG. 3A), and then process the poly-Si etching. Also, it will stack to $SiO_2$ or $Si_3N_4$ layer to form a spacer after etching (as shown in FIG. 3B), and the Si:Ge:B layer can be selectively etched (as shown in FIG. 3C) by a wet etching process ($CH_3COOH$:$HNO_3$:$HF$=33:26:1). The wafer can go through ion implantation and annealing on source and drain (as shown in FIG. 3D). After push into LPCVD system and fill in $SiH_4$:$WF_6$ gas to make selective W-CVD (as sown in FIG. 3E), the process is same as conventional process that is deposition of BPSG (Boron-Phorphous-Silica-Gass), etching of contact gap, deposition of metal layer and etching in order to finish device production.

The characteristics of the above processes are:

1. Utilize the high temperature annealing on Si:Ge:B layer to form the p-type poly-Si gate to eliminate the problem of fluorine ion in the BF2 ion implantation in p-type poly-Si gate that enhance the boron ion to pass through the oxide layer. This is because the Si:Ge:B layer use solid diffusion method without F atom.

2. The selective etching ratio of Si:Ge:B layer to Si can be over 1200 times, and even more than 10 times to oxide layer. Thus, it is very easy to adjust time to make excellent selective etching.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A process for producing a self-aligned tungsten strapped source/drain and gate for a deep submicron CMOS which comprises clearing a wafer, growing a n/p well; making an insulated area using LOCOS; growing a gate oxide, depositing onto the gate oxide poly-Si, processing the wafer through LPCVD to deposit a Si:Ge:B layer using $SiH_4$:$GeH_4$:$B_2H_6$; after high temperature annealing, the B in Si:Ge:B layer diffuses into the poly-Si gate to form the p-type poly-Si; subjecting the wafer to poly-Si etching and stacking to $SiO_2$ or $Si_3N_4$ layer to form a spacer after etching; selectively etching the Si:Ge:B layer by a wet etching process; subjecting the wafer to implantation and annealing on the source and drain; then subjecting the wafer to a LPCVD process and filling in with $SiH_4$:$WF_6$ gas to make selective W-CVD; which is followed by depositing BPSG, etching of contact gap, depositing a metal layer and etching in order to finish the device.

* * * * *